United States Patent [19]

Flohr et al.

[11] 4,337,432
[45] Jun. 29, 1982

[54] TESTING DEVICE FOR STRUCTURAL PARTS AND FUNCTIONS OF MOTOR VEHICLES

[75] Inventors: Peter Flohr; Franz Gumpinger, both of Munich, Fed. Rep. of Germany

[73] Assignee: Bayerische Motoren Werke Aktiengesellschaft, Munich, Fed. Rep. of Germany

[21] Appl. No.: 939,959

[22] Filed: Sep. 6, 1978

[30] Foreign Application Priority Data

Sep. 12, 1977 [DE] Fed. Rep. of Germany ....... 2741035

[51] Int. Cl.$^3$ ...................... F02P 17/00; G01R 13/42
[52] U.S. Cl. .................................... 324/379; 324/384
[58] Field of Search ................. 324/16 S, 16 R, 73 R, 324/379; 235/302; 364/580

[56] References Cited

U.S. PATENT DOCUMENTS 2,570,252 10/1951 Lindberg et al. .
3,253,134 5/1966 North, Jr. ......................... 324/73 R
3,956,689 5/1976 Murakami et al. ................ 324/16 S

FOREIGN PATENT DOCUMENTS 2234042 4/1973 Fed. Rep. of Germany .

OTHER PUBLICATIONS

Kaminski, R. K., "Computer Diagnosis of the VW", Instrumentation Technology, Sep. 1972, pp. 60-62.

Primary Examiner—Ernest F. Karlsen
Attorney, Agent, or Firm—Craig and Antonelli

[57] ABSTRACT

A testing device is disclosed for testing structural parts and functions of motor vehicles according to a test program having successive program stages. The testing device comprises a program switch for establishing circuit connections associated with the stages of the test program and for controlling a first indicator device for reproduction of the corresponding measurements. The program switch of the device further controls a second indicator device for reproduction of stored, rated measurements associated with the program stages so that a direct comparison of the rated and actual measurements can be quickly made.

8 Claims, 3 Drawing Figures

TESTING DEVICE FOR STRUCTURAL PARTS AND FUNCTIONS OF MOTOR VEHICLES

BACKGROUND AND SUMMARY OF THE INVENTION

The present invention relates to a testing device for testing structural parts and functions of motor vehicles, with a program switch which establishes the circuit connections associated with the stages of a test program, and which controls an indicator device for reproduction of corresponding actual measurements. Testing devices of this type are known, e.g. from U.S. Pat. No. 2,570,252 and German Offenlegungsschrift 2,458,644.

In another known device of this kind (Operating guide BMW program tester of Bayerische Motoren Werke (AG), the indicator device displays the actual measurements in analog form on an oscillograph, as well as in digital form by means of indicator instruments. To be able to determine and analyze a defect in the course of the testing program, the testing personnel need to have a high degree of attention and considerable experience; they have to know to what defects a wrong analog or digital value should be attributed.

An object of the present invention is to produce a testing device of the aforementioned type that will make a maximum of data available during the course of a test, with slight outlay in operation, so that the testing personnel need not have the high degree of attention and considerable experience formerly required.

The above-noted problems are solved according to particularly preferred embodiments of the present invention by providing that the program switch of the known device also controls a second indicator device for reproduction of the rated measurements associated with the program stages, from a storage.

At each program stage of the test program that runs either automatically or arbitrarily, the testing device delivers the appurtenant rated measurement in analog and/or digital form. Only a direct comparison of the rated and actual values is required. Therefore, even an unpracticed operator without testing experience will readily be able to recognize a defect and will be able to immediately interrupt the course of the test program, to initiate repair operations or further examination. Thus, the search for defects will be substantially shortened and made less expensive and the precision of defect analysis will be enhanced.

As compared to storage of the rated measurements e.g. on magnetic tape and display on a video instrument or by way of a computer, there is a further easing of the operation if the memory is a microfilm and the second indicator device is a microfilm reader device according to a particularly preferred embodiment of the invention. This makes possible a more rapid access to the rated measurements. Microfilms can be scanned and quickly and simply exchanged because they are easy to handle. The microfilm is preferably provided with supplementary indications that facilitate defect analysis, or that give instructions relating to repairs to be undertaken if a defect occurs.

The microfilm reader device is preferably an ordinary commercial cost-effective microfilm reader instrument. In alternative preferred embodiments the microfilm reader device is a television camera which is operably connected to a television picture screen. Thereby, from one central microfilm storage, a plurality of rated measurement indicator devices can be supplied, at various places.

According to a further embodiment of the present invention, the actual measurement is displayed for comparison with the rated measurement on a single indicator device. With such an arrangement a deviation of the actual from the given data can be recognized with particular ease and also with reduction of manufacturing outlay for the testing device.

Further, according to another feature of preferred embodiments of the present invention, the second indicator device (for the rated measurement) is made manually adjustable independently of the test program so that when a defect appears, the characteristic data for this defect can be reproduced on the second indicator device and thereby the defect can be verified immediately, to the extent that the storage contains these data.

The above and other objects, features and advantages of the present invention will become more apparent from the description of a preferred embodiment set forth hereinafter when considered in conjunction with the accompanying drawings wherein the same reference numerals are used to designate like parts throughout the several figures.

DETAILED DESCRIPTION OF THE DRAWINGS

Figure 1:
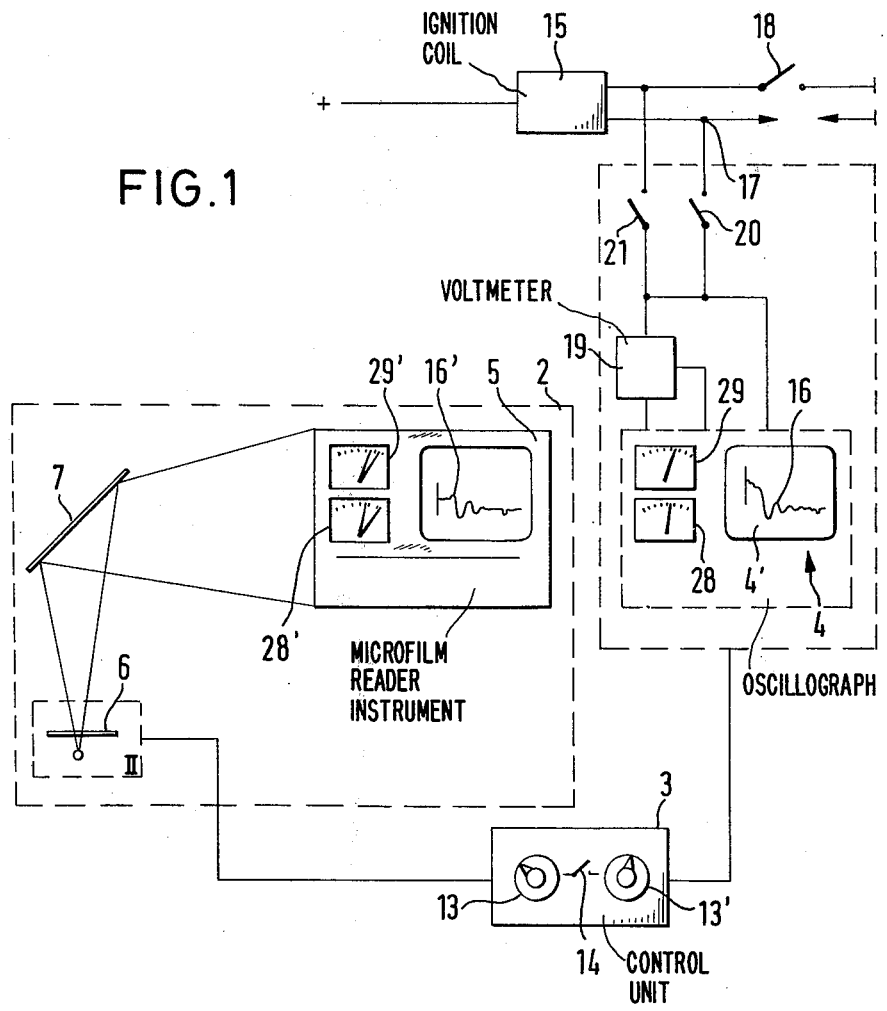
FIG. 1 is a schematic illustration of a testing device according to the present invention for testing structural parts and functions of motor vehicles with indicator devices for rated and measured values in analog and digital form.

The testing device according to FIG. 1 is constituted by a microfilm reader instrument 2 for reproduction of rated measurements for structural parts and functions of a motor vehicle, a control part 3 for running a test program, and an oscillograph 4 for reproduction of associated actual measurements during a dynamic test.

The microfilm reader instrument 2 has a frosted plate 5 as picture screen, on which an image of a microfilm 6 is projected via a mirror 7.

Figure 2:
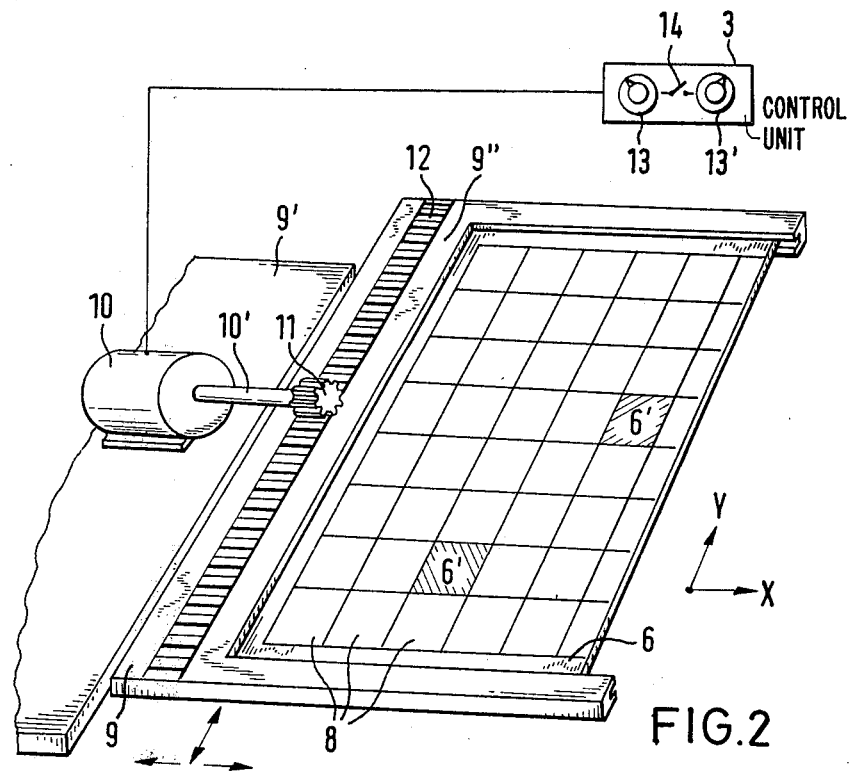
FIG. 2 is a front elevational view of an adjusting device for the rated measurements of FIG. 1.

As shown in FIG. 2, microfilm 6 consists of several columns 8 which are respectively associated for example with a vehicle type, and on which there is a plurality of images 6'. Microfilm 6 is held in a U-shaped part 9" of a frame 9 which is movable in the y direction with reference to part 9' of frame 9 which is movable in the indicated x direction, by a step motor 10. Step motor 10 is seated on part 9' and engages a pinion 11 at the end of its output shaft 10' in a tooth arrangement 12 on part 9" of frame 9.

In control unit 3, there is a rotatable step switch 13 of known construction such as described, e.g. in German Offenlegungsschrift No. 2,458,644, for the various circuit connections of the successive program stages of a test program, a step switch 13' for individual adjustment of an image 6' of microfilm 6 independently of the test program, and a switch 14 for interrupting and resetting a test program. That is, control unit 3 controls step motor 10 and with switch 14 step switch 13' can be energized instead of step switch 13 so that when a defect appears the characteristic data for this defect can be reproduced in the second indicator device and thereby the defect can be verified immediately to the extent that the storage contains the data.

On picture screen 4' of oscillograph 4, in testing the ignition system of a vehicle for example, for a cylinder of an internal combustion engine, the characteristic of the ignition voltage on the secondary side of an ignition coil 15 is reproduced as curve 16. In addition, on the high voltage output 17 of a coil 15 connected on the primary side via a breaker switch 18 to the ground pole of the vehicle electrical system, a voltmeter 19 can be connected via a contact 20 that can be acted on by control unit 3. Meter 19 is connected with oscillograph 4.

For the running of a test program, microfilm 6 is first adjusted by moving frame 9 in the x direction, to the column 8 which is type-specific. If step switch 13 is in its first switching position for the first program stage, the first image 16' in column 8 will be displayed on picture screen 5 of microfilm reader instrument 2, controlled by step switch 13. It shows for example the connecting operations to be undertaken, for the meter on the structural part to be tested in the course of the program.

After completion of these operations, step switch 13 will be turned to its second switching position, either manually or by remote control. Step motor 10 moves a part 9" of frame 9 in the y direction so that the second image 6' of the adjusted column 8 will be projected on screen 5. On screen 5, there appear curve 16' of the ignition voltage characteristic at high voltage output 17 of ignition coil 15 in the correct state of the ignition systems as rated value as well as ranges of rated measurements, and directions concerning operation and repair. At the same time control unit 3 establishes the connection between the structural part to be examined, e.g. ignition coil 15, the meter, voltmeter 19 and oscillograph 4, by closing contact 20.

By means of control devices that are not illustrated, curves 16 of the voltage characteristic at the high voltage output of ignition coil 15 for the cylinders of the internal combustion engine are shown in succession as measured values, on screen 4' of oscillograph 4. By the immediately opposed analog rated and actual measurements, these can be readily compared and a difference between curves 16' and 16 can be easily recognized.

If curves 16 of the actual measurements correspond for all cylinders with curves 16' of the rated values, step switch 13 will be brought into its third switching position, for the third stages of the testing program. In this for example the ignition voltage on the primary side of coil 15 will be tested. For this, contact 20 will be opened via control unit 3, and a contact 21 between the primary side of ignition coil 15 and voltmeter 19 will be closed.

If on the contrary curves 16 and 16' of the actual and rated measurements fail to correspond—a curve 16 that differs from curve 16' for the rated measurements in correct state of the part being tested (ignition coil 15) is shown on screen 4' and a defect of the part can be rapidly and simply recognized. In the present case for example an interference resistor of the ignition system is defective.

For checking the defect, instead of the illustrated curve 16' for the rated measurement in correct state of the structural part, a curve that is characteristic of the detected defect can be reproduced on screen 5 of microfilm reader instrument 2. For this, the selected setting of microfilm 6 can be cut off by switch 14, and possibly after adjustment another column 8 of microfilm 6 or of another microfilm disposed in another level can be brought into projection by turning step switch 13' which is then active, to show an image 6' in the said column 8, in that control unit 3 controls step motor 10 corresponding to the selected setting of step switch 13'. Image 6' contains a curve that is characteristic of the assumed defect.

If the defect is eliminated renewed actuation of switch 14 will again energize step switch 13 instead of step switch 13', and curve 16' of the rated measurement for the set program stage will once again be displayed, in that part 9" of frame 9 will be restored to its initial position by step motor 10.

Figure 3:
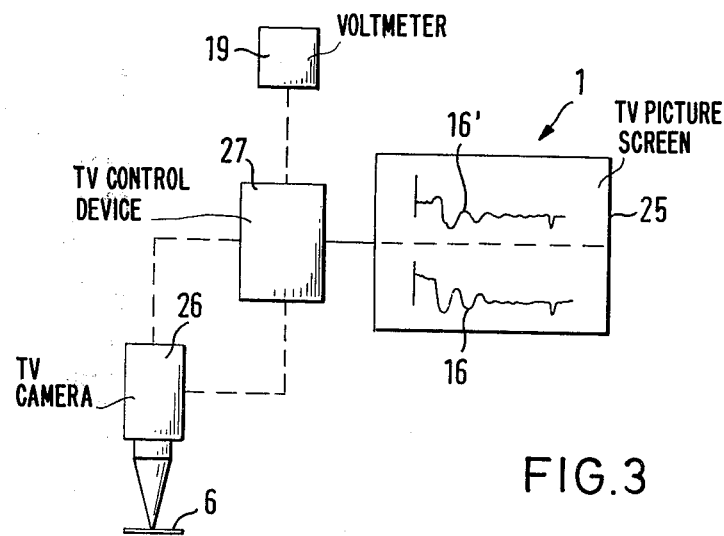
FIG. 3 is a schematic illustration of another embodiment according to the present invention which is a modification of the testing device of FIG. 1.

In FIG. 3, a testing device 1' presents a television picture screen 25 on which curve 16' for the rated measurements and curve 16 for the actual measurements are drawn one above the other or possibly on each other. The reproduced characteristic of the secondary ignition voltage on coil 15 is taken on the one hand as rated value from microfilm 6 via a television camera 26 and shown via a television control device 27 in the upper part of picture screen 25. Curve 16 of the actual measurement, corresponding to FIG. 1, is determined with voltmeter 19 and displayed via television control device 27 in the lower part of screen 25.

Defect detection is substantially simplified by the close reproduction of curves 16' and 16 for the rated and measured values. Moreover, even slight deviations of the two curves can be determined.

Curves 16 and 16' can be supplementarily connected by the television control device 27. Thus for example it is possible, instead of the two curves 16 and 16', or supplementing them, to show the difference curves of the two curves 16 and 16'. Such connections additionally simplify defect detection.

Further, according to the present invention, instead of microfilm reader instrument 2 or television camera 26 for example, there may be a slide projector (not shown) that will display the rated values stored on slides.

Instead of the illustrated testing of a structural part or several functionally related structural parts by means of a test program, individual measurement of a function of a structural part is also possible. Thus for example for testing a motor, e.g. for a windshield wiper, the characteristic of the current take-up of this motor when it is switched on can be determined by a current measuring device and represented as the curve of a measured value. This is then compared with the curve in correct function of the motor as rated value.

Corresponding to the illustrated reproduction of analog actual and rated values (curves 16 and 16') with supplementary measuring instruments, e.g. indicators (for instance voltmeter 28 and closing angle indicator 29) or the analog-to-digital converter connected after meter 19, actual measurements in digital form can be obtained and compared with rated measurements in digital form. For this, characteristic rated values 30 are provided on images 6' of microfilm 6 for each program stage. Possibly in conjunction with supplementary directions 31, they are simultaneously reproduced with the corresponding rated measurements in analog form, and without extra effort in operation they will substantially facilitate testing and defect analysis.

We claim:
1. In a testing device for testing structural parts and functions of motor vehicles according to a test program having successive program stages, said testing device comprising a manually operable program switch means for establishing circuit connections associated with the stages of the test program and for controlling a first indicator means for reproduction of the corresponding measurements, the improvement comprising said manually operable program switch means further controlling a second indicator means for reproduction of stored, rated measurements associated with the respective, successive program stages, said second indicator means reproducing the rated measurements in spaced relation, as opposed to superimposed relation, to the reproduction of the actual measurements by the first indicator means whereby said actual and rated measurements can be readily compared, and wherein means are provided for manually adjusting said second indicator means independently of the test program so that when a defect appears stored characteristic data for the defect may be reproduced on the second indicator means whereby the defect can be verified immediately.

2. The testing device according to claim 1, wherein the rated measurements are stored on microfilm and said second indicator means is a microfilm reader device.

3. The testing device according to claim 2, wherein said microfilm reader device is a commercially available reader instrument.

4. The testing device according to claim 2, wherein the microfilm reader device is a television camera which is operably connected to a television picture screen.

5. The testing device according to claim 1, 2, 3 or 4, wherein said first and second indicator means reproduce the actual measurements and the rated measurements for comparison on a single indicator device.

6. The testing device according to claim 1, wherein in one stage of said test program the program switch means establishes a circuit connection for measuring the ignition voltage on the secondary side of an ignition coil of an internal combustion engine, the characteristic of the measured ignition voltage being reproduced by said first indicator means and wherein in said one stage the program switch means controls the second indicator means for reproduction of a stored, rated ignition voltage characteristic for the secondary side of the ignition coil of said internal combustion engine.

7. The testing device according to claim 6, wherein in another stage of said test program the program switch means establishes a circuit connection for measuring the ignition voltage on the primary side of the ignition coil, the characteristic of the measured ignition voltage being reproduced by said first indicator means and wherein in said another stage the program switch means controls the second indicator means for reproduction of a stored, rated ignition voltage characteristic for the primary side of the ignition coil.

8. The testing device according to claim 1, wherein said means for manually adjusting the second indicator means independently of the test program includes a manually operable step switch.

* * * * *